United States Patent
Hong

[11] Patent Number: 5,869,978
[45] Date of Patent: Feb. 9, 1999

[54] CIRCUIT FOR REMOVING NOISE COMPONENTS OF OSCILLATOR

[75] Inventor: Sun-Ho Hong, Kyeongki-do, Rep. of Korea

[73] Assignee: Daewoo Electronics Co., Ltd., Seoul, Rep. of Korea

[21] Appl. No.: 822,090

[22] Filed: Mar. 20, 1997

[30] Foreign Application Priority Data

Nov. 30, 1996 [KR] Rep. of Korea .................. 96-60669
Nov. 30, 1996 [KR] Rep. of Korea .................. 96-60671

[51] Int. Cl.⁶ .................................................. H03K 3/295
[52] U.S. Cl. ............................ 326/24; 326/27; 326/28; 365/206
[58] Field of Search ........................... 331/75; 326/24, 326/25, 26, 27, 28, 29; 365/206

[56] References Cited

U.S. PATENT DOCUMENTS 3,984,703 10/1976 Jorgensen .......................... 307/279
4,369,381 1/1983 Okamoto et al. .................. 307/279
5,602,496 2/1997 Mahmood .......................... 326/71

*Primary Examiner*—Vu A. Le
*Attorney, Agent, or Firm*—Pillsbury Madison & Sutro LLP

[57] ABSTRACT

Disclosed is a circuit for removing noise components included in a signal which an oscillator generates by using an integrator and hysteresis characteristic. The signal is oscillated by an oscillator. A square-wave generating inverter receives a sine wave signal including noise components oscillated by a quartz crystal oscillator circuit and then generates a square-wave signal having improved RC and integrator characteristics, and provides the generated square-wave signal to a Schmitt trigger. The Schmitt trigger receives the square-wave signal including the noise components from the square-wave generating inverter and removes the noise components included in the received square-wave signal. The circuit can remove noise components included in a signal oscillated by an oscillator due to a surrounding influence such as a temperature. Therefore, state clocks which is used in a microprocessor and a microcontroller, may be generated.

19 Claims, 13 Drawing Sheets

FIG.6
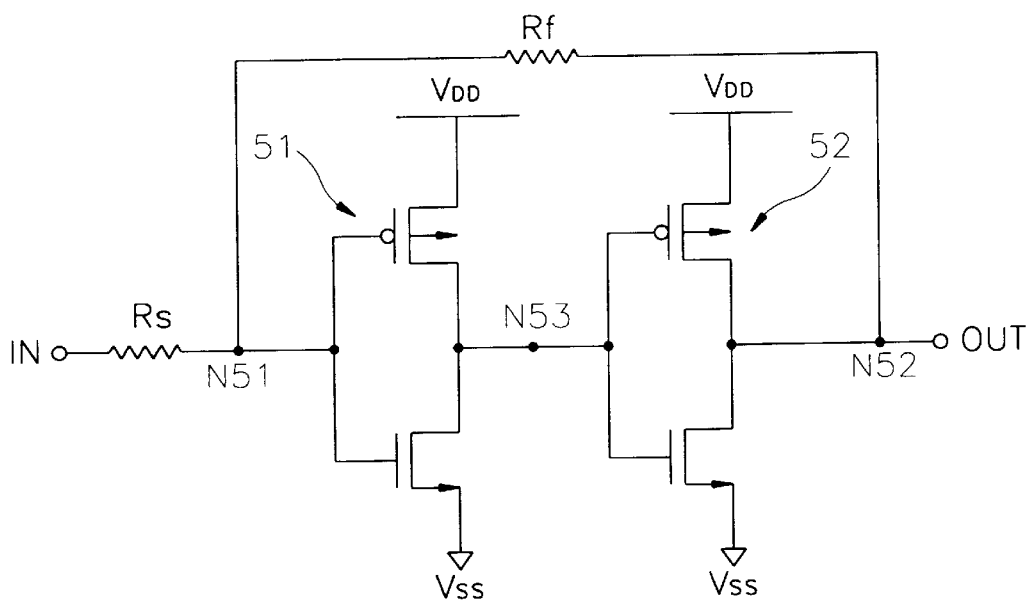
FIG.7
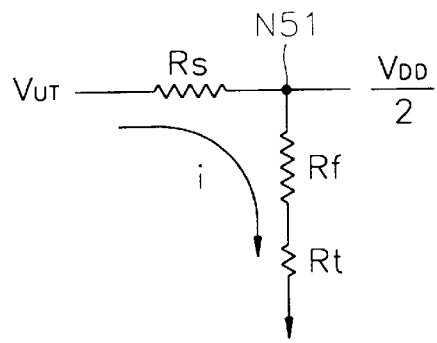
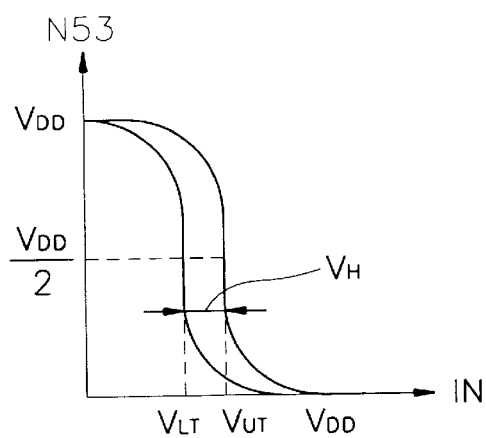
FIG. 8

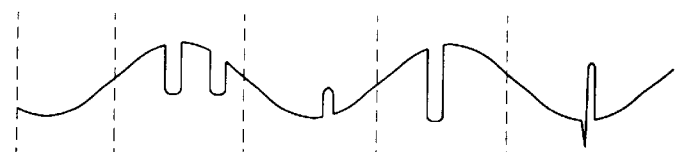
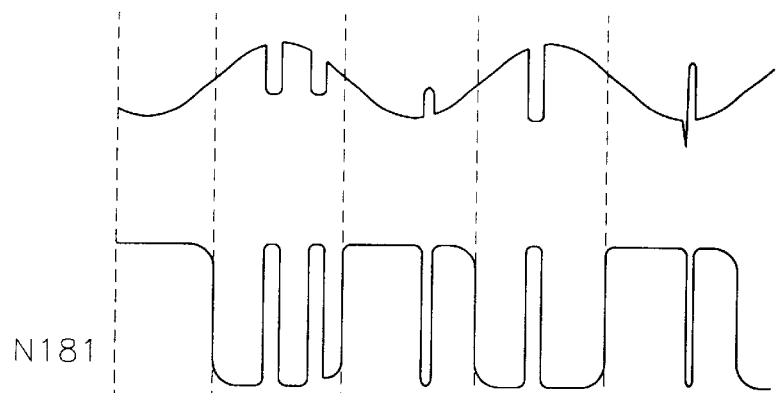
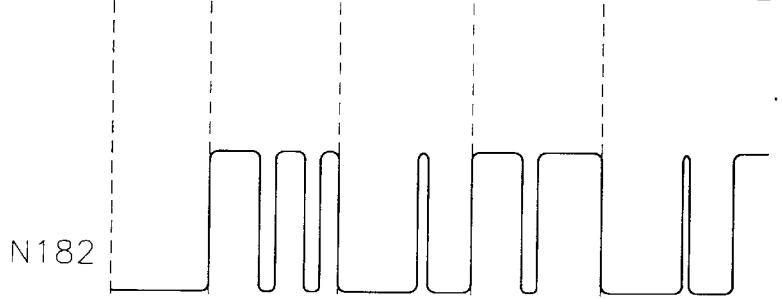
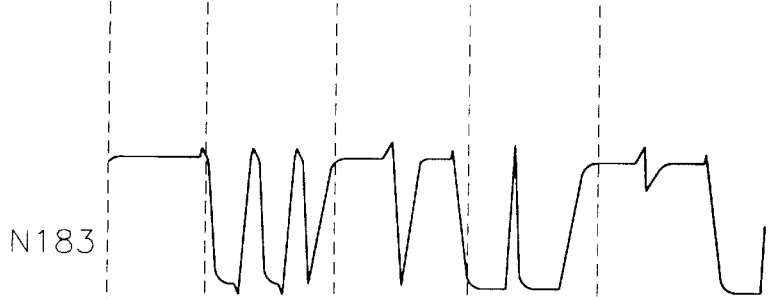
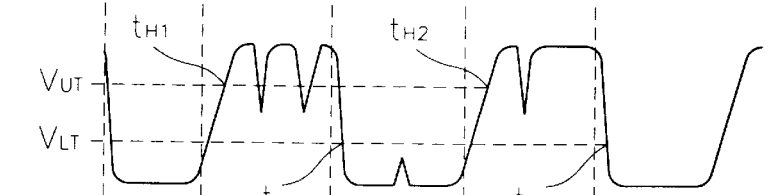
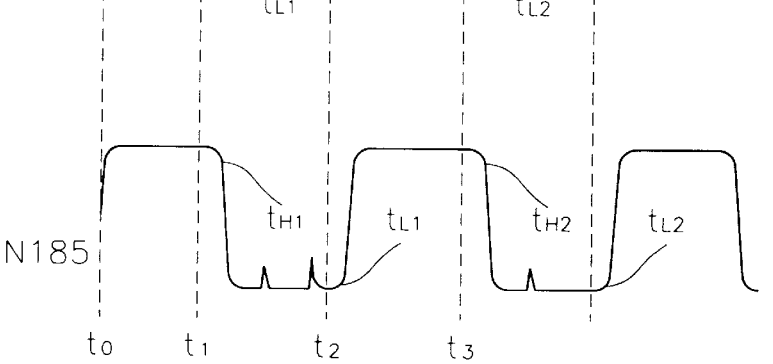

5,869,978

CIRCUIT FOR REMOVING NOISE COMPONENTS OF OSCILLATOR

BACKGROUND OF THE INVENTION

1. Field of the Invention

The present invention relates to a circuit for removing noise components. More particularly, the present invention relates to a circuit for removing noise components included in a signal which an oscillator generates by using an integrator and hysteresis characteristic.

2. Description of the Prior Art

Electronic components such a microprocessor and a micro-controller designate a division of a state in a system definition, define every state, and perform a system operation in order to easily transport data among function blocks during the design thereof. Since such state is exclusively operated, a plurality of state divisions necessary to define the system are designated. A quartz crystal oscillator (which can be applied to the present invention) is used to generate a signal for generating the state clock. The quartz crystal oscillator is widely used for generating a signal which is inputted to a state clock generator, which generates a state clock signal necessary to drive a microprocessor.

FIG. 1 is a block diagram for showing a configuration of a state clock signal generating apparatus 10 using a quartz crystal oscillator. FIGS. 2A to 2E are waveform diagrams of signals from components in FIG. 1 when an operation of a quartz crystal oscillator circuit is normal. State clock signal generating apparatus 10 includes a quartz crystal oscillator circuit 11 and a state clock generator 13.

Quartz crystal oscillator circuit 11 includes a vibrator 111 formed by a quartz 1111 and quartz input plates 1112 and 1113; an amplifier 112 having an inverter 1121 connected to both terminals of vibrator 111 in parallel and having a feedback resistor 1122 connected to inverter 1121 in parallel; and first and second condensers 114 and 115 coupled between both terminals of vibrator 111 and a ground Vss.

A supply voltage from a power supply (not shown) is applied to vibrator 111 of quartz crystal oscillator circuit 11. Then, vibrator 111 oscillates a sine wave signal having a predetermined level and outputs a first node Nil. The output signal is applied to amplifier 112 and outputted to a second node N12. The amplified sine wave signal outputted to the second node Mn has a waveform as shown in FIG. 2A.

State clock generator 13 receives the amplified sine wave signal from quartz crystal oscillator circuit 11 and generates a normal clock signal as shown in FIG. 2B and various kinds of state clock signals S1, S2 and S3 necessary to operate a micom. Examples of state clock signals S1, S2 and S3 which state clock generator 13 generates are shown in FIGS. 2C to 2E.

In the conventional state clock signal generating apparatus 10, when quartz crystal oscillator circuit 11 is normally operated without being influenced by a circumference, quartz crystal oscillator circuit 11 oscillates a sine wave signal without noise components as shown in FIG. 2A, and state clock generator 13 generates state clock signals using the sine wave signal from quartz crystal oscillator circuit 11 and provides the generated state clock signals to an inside of a microprocessor.

FIG. 2F is a waveform diagram of the signals from components in FIG. 1 when a quartz crystal oscillator circuit generates a signal including noise components.

When an output oscillation signal including noise components of quartz crystal oscillator circuit 11 as shown in FIG. 2F is applied to the microprocessor, it deals state clock generation of the microprocessor a fatal below. That is, the microprocessor can normally be operated.

U.S. Pat. No. 3,984,703, (issued to Horace Action on Aug. 18, 1992) discloses one example of a circuit for removing a noise of an oscillator. U.S. Pat. No. 3,984,703 relates to a complementary MOS (CMOS) Schmitt trigger for deriving transfer functions having hysteresis. The input of the Schmitt trigger is applied in parallel to the gates of a plurality of stacked MOS transistors. The stacked transistors are connected with their respective source and drain electrodes in series with a source of potential and with the drain electrode of a p channel transistor being connected to the adjacent drain electrode of an n channel transistor to define an output node on which the output hysteresis signal is derived. Upper and lower trip point reference potentials are established on the respective source electrodes of the output node defining p and n channel transistors. At least one of the trip point reference potentials is gated to the respective source electrode as a function of the state of the output, i.e., whether the output is high or low. The input signal is compared in stack with the established trip point reference potentials to derive the upper and lower trip points dependent upon the signal of the change in the transfer function of the device. The output hysteresis signal is inverted and a portion of the inverted output signal is fed back via a second inverter to the output node for stabilizing the output signal. U.S. Pat. No. 3,984,703 has a transfer characteristic having hysteresis but cannot remove the noise components included in the signal oscillated by an oscillator.

SUMMARY OF THE INVENTION

Therefore, an object of the present invention is to provide a circuit for removing the noise components included in the signal oscillated by an oscillator owing to an influence of a printed circuit board noise, electromagnetic interference (EMI), and a switching noise of other devices to improve a reliability of an integrated circuit.

In order to achieve the object, the present invention provides a circuit for removing noise components of an oscillator, the circuit comprising:

an inverter for receiving a sine wave signal including noise components oscillated by an oscillator, and for generating a square-wave signal having improved RC and integrator characteristics; and a Schmitt trigger for receiving the square-wave signal including the noise components from the inverter, and for removing the noise components included in the a received square-wave signal.

Also, the present invention provides a circuit for removing a noise of an oscillator, the circuit comprising:

an inverter for receiving a sine wave signal including noise components oscillated by an oscillator, and for generating a square-wave signal having improved RC and integrator characteristics;

a first Schmitt trigger for receiving the square-wave signal including the noise components from the inverter, and for removing a part of the noise components included in the received square-wave signal; and a second Schmitt trigger for receiving the square-wave signal with a part of the noise components removed from the first Schmitt trigger, and for removing noise components included in the received square-wave signal with the part of the noise components removed.

Also, the present invention provides a circuit for removing noise components of an oscillator, the circuit comprising:

a buffer for receiving a sine wave signal including noise components oscillated by an oscillator, and for generating a square-wave signal whose duty cycle is controlled and which includes the noise components; and a Schmitt trigger for receiving the generated square-wave signal whose duty cycle is controlled and which includes the noise components and for removing the noise components included in the received square-wave signal.

The above circuit for removing noise components oscillated by an oscillator can remove noise components included in a signal oscillated by an oscillator due to a surrounding influence such as a temperature. Therefore, state clocks which are used in a microprocessor and a microcontroller can be generated.

BRIEF DESCRIPTION OF THE DRAWINGS

The above objects and advantages of the present invention will become more apparent by describing in detail a preferred embodiment thereof with reference to the attached drawings, in which:

FIG. 6 is a circuit diagram for showing a configuration of first and second COOS inserters as one example of first and second inserters;

FIG. 7 is an equivalent circuit diagram of the Schmitt-trigger of FIG. 6, approximated by passive elements;

FIG. 8 is a graph for illustrating the input-output characteristic of the equivalent circuit of the Schmitt-trigger shown in FIG. 7;

FIGS. 17A to 17F are waveform diagrams of signals from components in FIG. 16.

DESCRIPTION OF THE PREFERRED EMBODIMENTS

A description will be given below in detail, with reference to the accompanying drawings, of the mechanical structure, the circuitry configuration, and the operation of the circuit for removing noise components of an oscillator according to one embodiment of the present invention.

Figure 1:
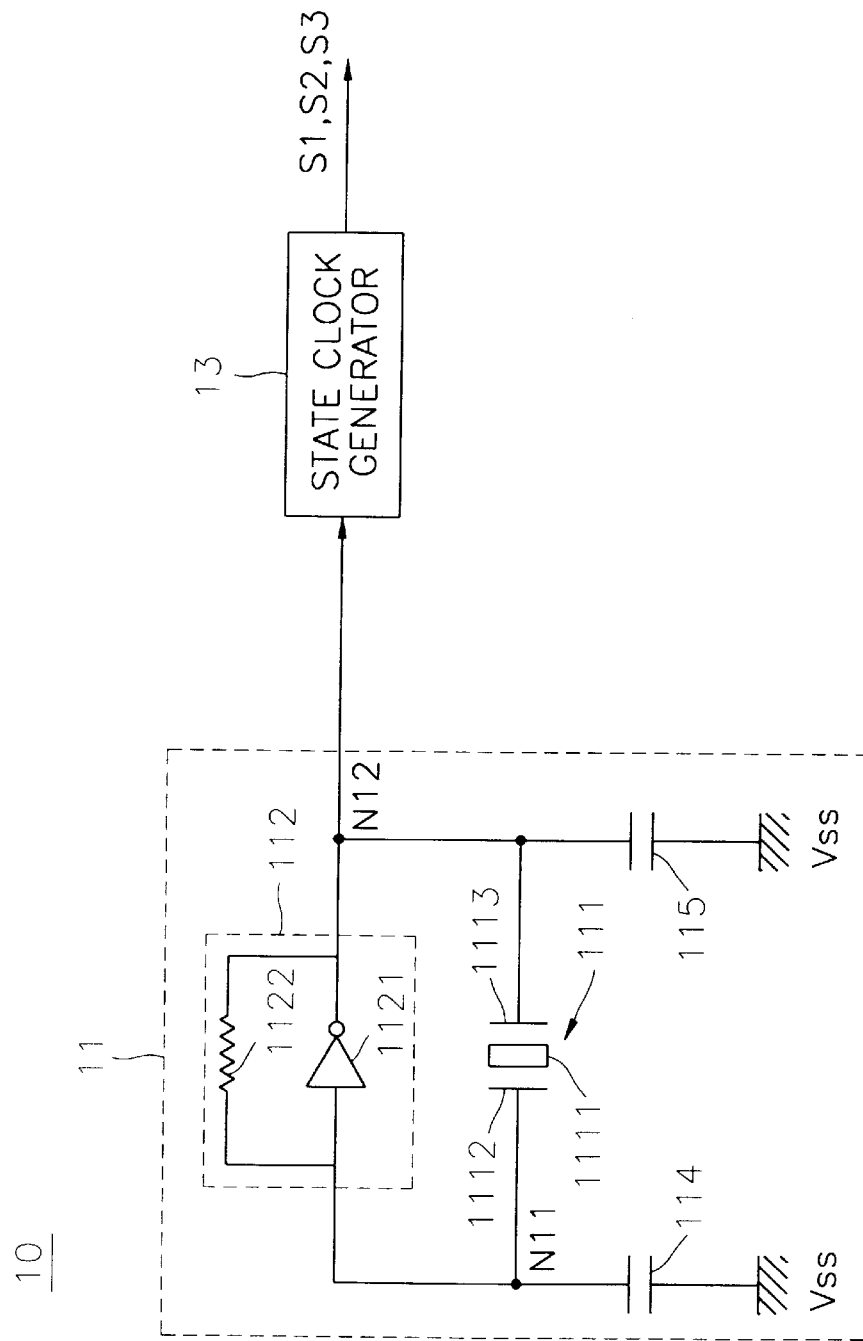
FIG. 1 is a block diagram for showing a configuration of a conventional state clock signal generating apparatus using a quartz crystal oscillator circuit.
Figure 2A:
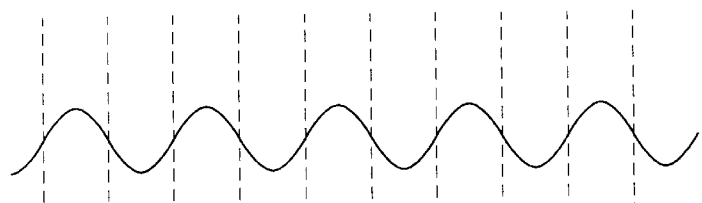
FIGS. 2A to 2E are waveform diagrams of signals from components in FIG. 1 when an operation of a quartz crystal oscillator circuit is normal.
Figure 2B:
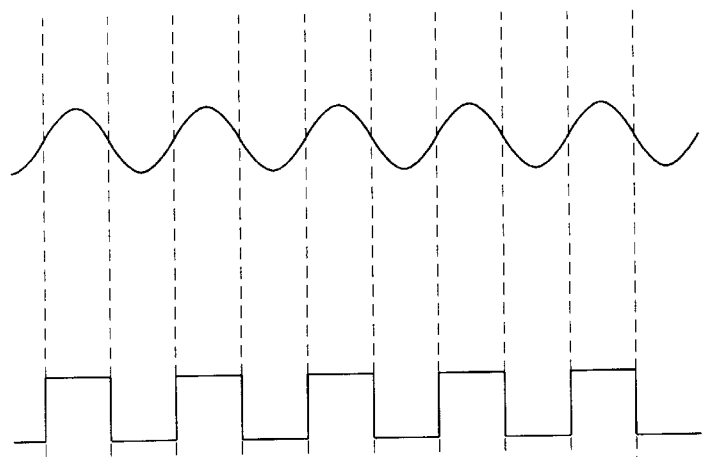
Figure 2C:
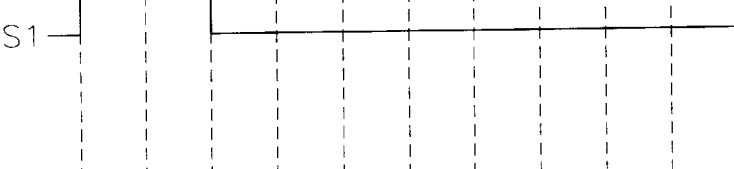
Figure 2D:
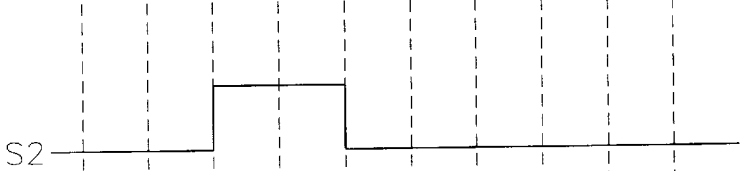
Figure 2E:
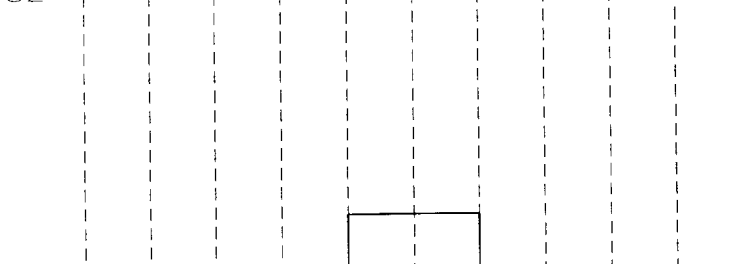
Figure 2F:
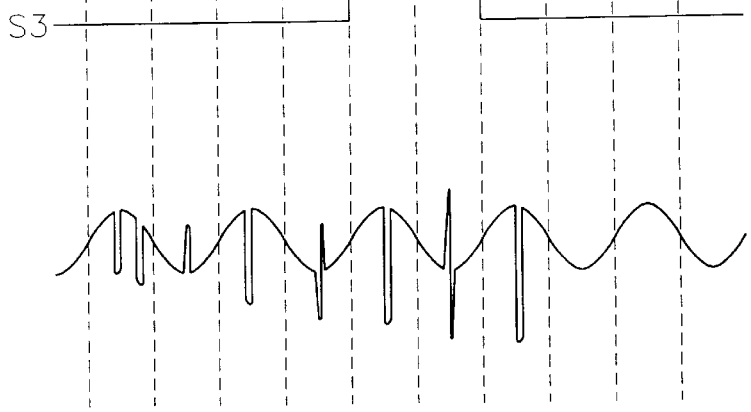
FIG. 2F is a waveform diagram of signals from components in FIG. 1 when a quartz crystal oscillator circuit generates signal including noise components.
Figure 3:
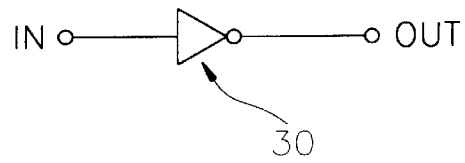
FIG. 3 is a circuit diagram of a general inverter.
Figure 4:
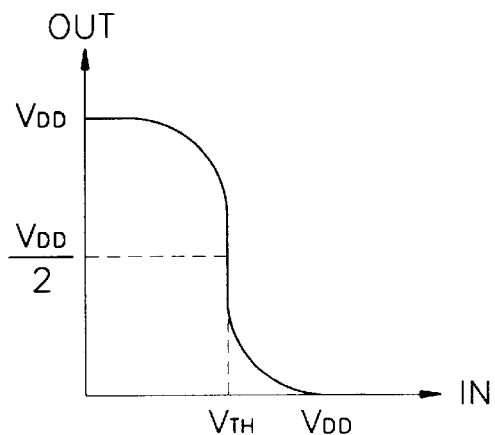
FIG. 4 is a graph for showing an input-output characteristic of the inverter shown in FIG. 3.

FIG. 3 is a circuit diagram of a general inverter 30. Inverter 30 inverts a voltage level of an input signal IN and outputs an inverted signal OUT. FIG. 4 shows an inputoutput characteristic of the inverter shown in FIG. 3. The output voltage level is high or low, depending on the low or high level of the input voltage. When the inverter 30 is constructed by a complementary metal oxide semiconductor (CMOS) device, the CMOS device is often designed to have a threshold voltage $V_T$ of $V_{DD}/2$ for turning the CMOS device on or off, wherein $V_{DD}$ represents the power supply voltage applied across the threshold voltage $V_T$ of $V_{DD}/2$ is preferable for the purpose of increasing the margin of the input voltage. In the following description, it is assumed that the threshold voltage of of a CMOS inverter is $V_{DD}/2$. As shown in FIG. 4, a single inverter has no hysteresis curve with respect to the input and output voltages. Therefore, the output voltage is turned from a high level to a low level or vice versa when the input voltage reaches the threshold voltage $V_T$ during the rising or falling of the input voltage, respectively.

Figure 5:
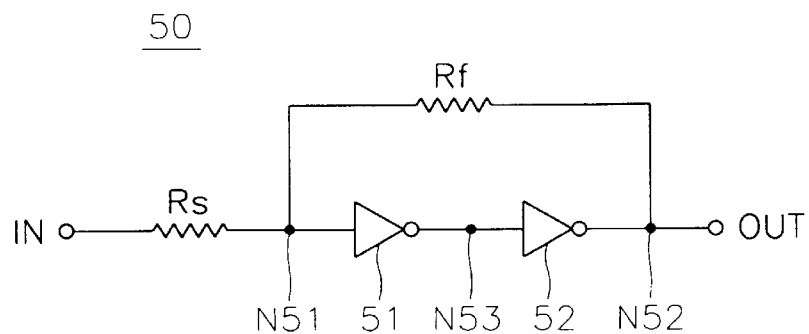
FIG. 5 is a circuit diagram for showing a configuration of a Schmitt-trigger which can be used in the present invention.

FIG. 5 is a circuit diagram for showing a configuration of a Schmitt-trigger 50 which can be used in the present invention. Schmitt-trigger 50 includes first and second inverters 51 and 52 connected in series and a feedback resistance $R_f$ connected in parallel to the first and second inverters 51 and 52. There is an input resistance Rs between the connecting point N51 and the input terminal IN of Schmitt-trigger 50, wherein the connecting point N51 connects the input resistor to the input end of the first inverter 51. The input resistance Rs includes the output impedance of a signal source (not shown) connected to the input terminal IN.

FIG. 6 is a circuit diagram for showing a configuration of first and second CMOS inverters as one example of first and second inverters 51 and 52. Since first and second CMOS inverters 51 and 52 are connected in series, the voltage phase at the connecting point N51 of the first CMOS inverter 51 is equal to that at a connecting point N52 between the output end of the second CMOS inverter 52 and the output terminal OUT. When the voltages at the connecting points N51 and N52 are both zero, the voltage at the third connecting point N53 between first and second CMOS inverters 51 and 52 is equal to the power supply voltage $V_{DD}$. In contrast, when the voltages at the first and second connecting points N51 and N52 are both $V_{DD}$, the voltage at the second connecting point N52 is equal to zero.

FIG. 7 is an equivalent circuit diagram of the Schmitt-trigger 50 of FIG. 6, approximated by passive elements. Since the input resistance of first or second CMOS inverter 51 or 52 can be regarded as infinite, and since the output resistance of second CMOS inverter 52 is equal to the resistance Rt equivalent to the resistance of the p-channel or n-channel field-effect transistor (FET) in the output side of the second CMOS inverter 52, the equivalent circuit 60 has the input resistance Rs, the feedback resistance $R_f$ and the equivalent resistance Rt connected in series.

In an operation of Schmitt-trigger 50, when the input voltage reaches a value $V_{UT}$ (during the increasing of the input voltage from zero volts to $V_{DD}$), the voltage at the first connecting point N51 of the first CMOS inverter 51 reaches $V_{DD}/2$, so the voltage level at the output of the first CMOS inverter 51 changes from $V_{DD}$ to zero volts, and then the voltage level at the output of second CMOS inverter 51 changes from zero volts to $V_{DD}$. The change in the voltage at the third connecting point N53 is illustrated with respect to the input voltage. The voltage $V_{UT}$ is referred to as an upper threshold voltage. If it is assumed that the current flowing through the input resistor Rs is "i", the following equation is obtained.

$$V_{UT} - V_{DD}/2 = i \cdot Rs \quad (1)$$

The equivalent resistance Rt can be neglected because the feedback resistance $R_f$ is much greater than the equivalent resistance Rt. Therefore, the following equation is also obtained.

$$V_{DD}/2 = i \cdot R_f \quad (2)$$

From the above two equations (1) and (2), the upper threshold voltage $V_{UT}$ can be expressed as:

$$V_{UT} = V_{DD} \cdot (R_f + Rs)/R_f \quad (3)$$

On the contrary, when the input voltage reaches a value $V_{LT}$ during the decreasing of the input voltage from $V_{DD}$ to zero volts, the voltage at the input end N51 of the first CMOS inverter 51 reaches $V_{DD}/2$, so that the voltage level at the output of the second CMOS inverter 52 is turned from $V_{DD}$ to zero volts. The voltage $V_{LT}$ is referred to as a lower threshold voltage. In this case, since the output voltage is higher than the input voltage, current "i" flows from the output terminal OUT to the input terminal IN. Therefore, the following equation is obtained.

$$V_{DD}/2 - V_{LT} = i \cdot Rs \quad (4)$$

From the equations (2) and (4), the lower threshold voltage can be expressed as:

$$V_{LT} = V_{DD}/2 \cdot (R_f - Rs)/R_f \quad (5)$$

Consequently, the upper threshold voltage $V_{UT}$ differs from the lower threshold voltage $V_{LT}$. Therefore, the CMOS inverter in the Schmitt-trigger of FIG. 5 has a hysteresis curve with respect to the input and output voltages of the inverter. FIG. 8 illustrates the input-output characteristic of the equivalent circuit 70 of Schmitt-trigger 50 shown in FIG. 7. In FIG. 8, the difference between the upper threshold voltage and the lower threshold voltage is referred to as a Schmitt width $V_H$. From the equations (3) and (4), the Schmitt width $V_H$ can be expressed as:

$$V_H = V_{UT} - V_{LT} = Rs/R_f \times V_{DD}/2 \quad (6)$$

As will be understood from the equation (6), the Schmitt width $V_H$ depends on the input resistance Rs. As previously mentioned, the input resistance Rs includes the impedance of the input-signal source.

Figure 9:
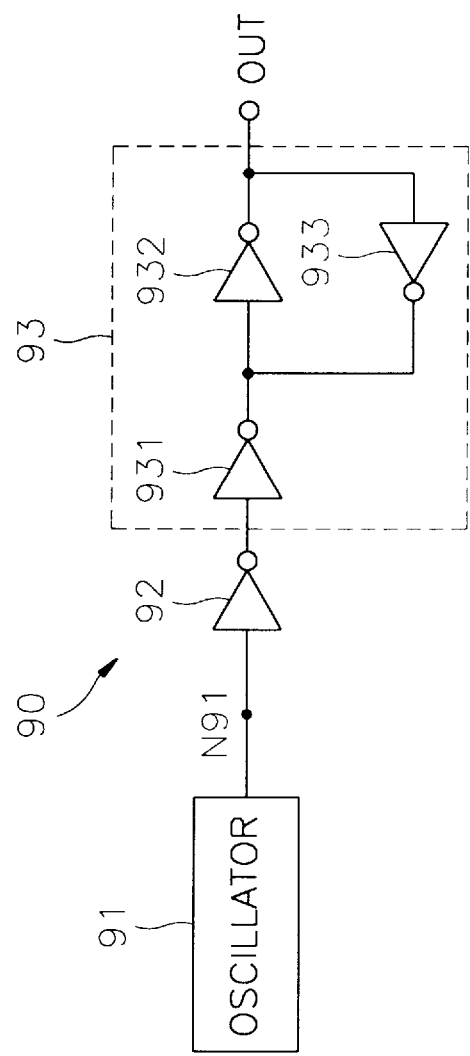
FIG. 9 is a circuit diagram for showing a configuration of a circuit for removing a noise of an oscillator according to a first embodiment of the present invention.

FIG. 9 shows a configuration of a circuit for removing noise components of an oscillator according to a first embodiment of the present invention. A circuit for removing noise components of a quartz crystal oscillator according to a first embodiment of the present invention includes a square-wave generating inverter 92 and a Schmitt trigger 93. Square-wave generating inverter 92 receives a sine wave signal including noise components oscillated by a quartz crystal oscillator circuit 91, generates a square-wave signal having improved RC and integrator characteristics, and provides the generated square-wave signal to Schmitt trigger 93. Schmitt trigger 93 receives the square-wave signal including the noise components from square-wave generating inverter 92 and removes the noise components included in the received square-wave signal. Schmitt trigger 93 includes a first MOS inverter 931 for firstly inverting the square-wave signal including the noise components from square-wave generating inverter 92; a second MOS inverter 932 connected to an output terminal of first MOS inverter 931, for secondly inverting the first-inverted square-wave signal from first MOS inverter 931; and a feedback inverter 933 including an input terminal connected to an output terminal of second MOS inverter 932 and an output terminal connected to an input terminal of second MOS inverter 932, for feedbacking the second-inverted square-wave signal to the input terminal of second MOS inverter 932.

Figure 10:
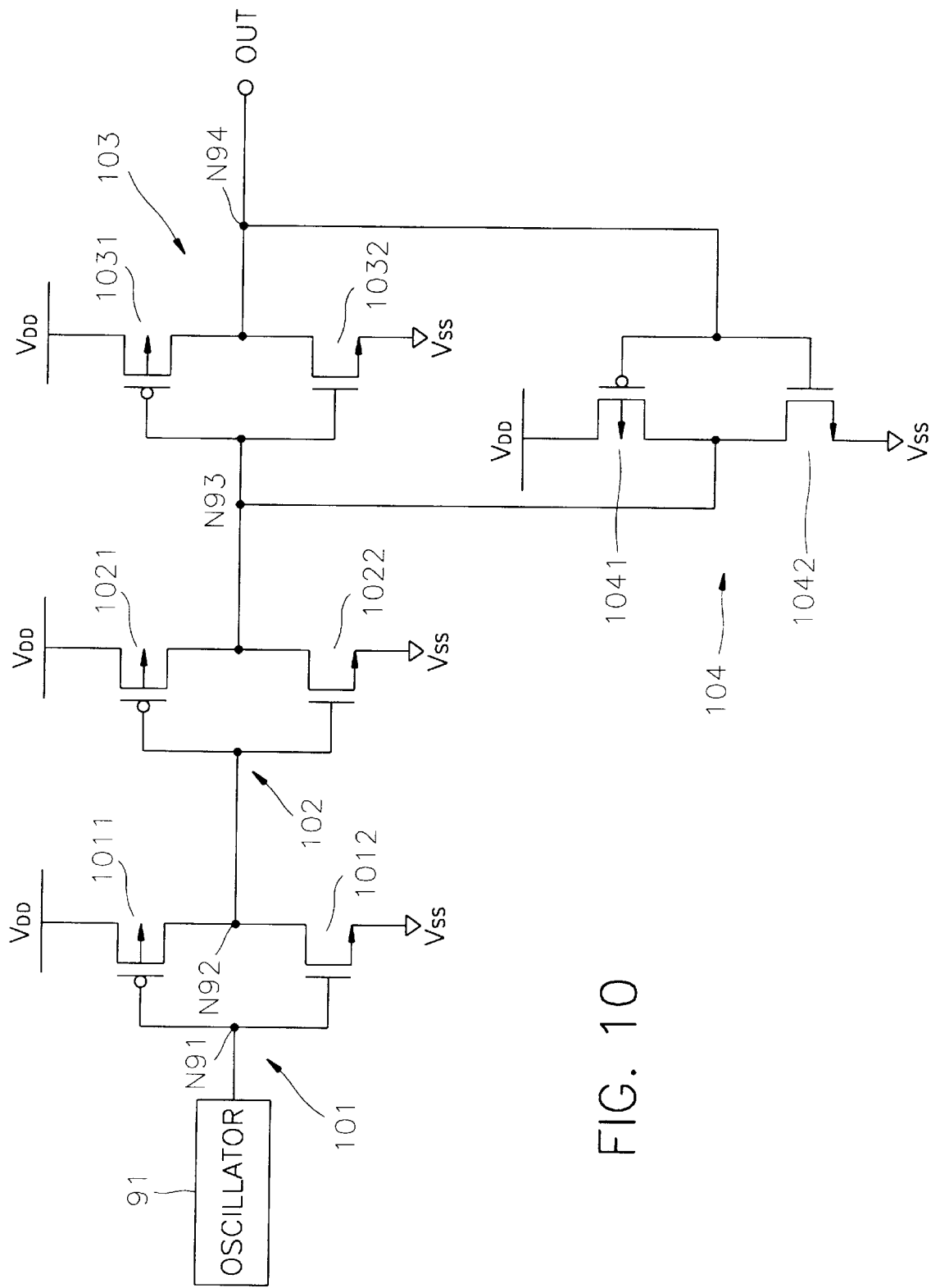
FIG. 10 is a circuit diagram for detailedly showing one example of the circuit for removing a noise of an oscillator shown in FIG. 9.

FIG. 10 shows one example of the circuit for removing a noise of an oscillator shown in FIG. 9. Square-wave generating inverter 92 includes a CMOS inverter composed of a P type MOS transistor 1011 and an N type MOS transistor 1012 and inverts the sine wave signal including noise components oscillated by quartz crystal oscillator 91. First MOS inverter 931 includes a first CMOS inverter 102 formed by a P type MOS transistor 1021 and an N type MOS transistor 1022. Second MOS inverter 932 includes a second CMOS inverter 103 formed by a P type MOS transistor 1031 and an N type MOS transistor 1032. Feedback inverter 933 includes a third CMOS inverter 104 formed by a P type MOS transistor 1041 and an N type MOS transistor 1042. It is preferred that a resistance of third CMOS inverter 104 is greater than that of first CMOS inverter 102 so that Schmitt trigger 93 can have a hysteresis characteristic. A resistance ratio of third CMOS inverter 104 to first CMOS inverter 102 is preferably 1:5.

Figure 11A:
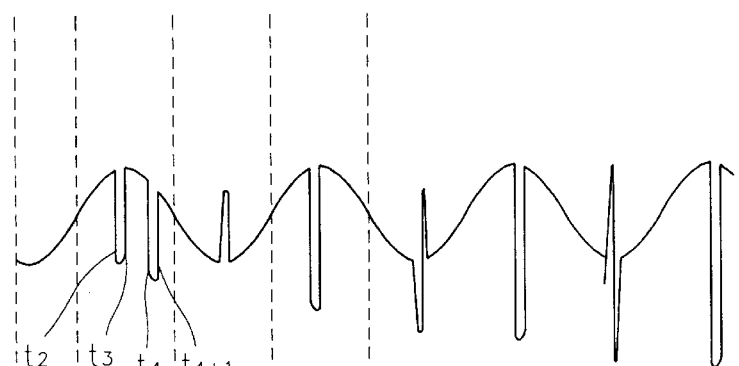
FIGS. 11A to 11D are waveform diagrams of signals from components in FIG. 10.

An operation of a circuit for removing noise components of a quartz crystal oscillator according to a first embodiment of the present invention will be described with reference to the accompanying drawings. When a supply voltage from a power supply (not shown) is applied to quartz crystal oscillator circuit 91, quartz crystal oscillator circuit 91 oscillates a sine wave signal including noise components as shown in FIG. 11A (node N91).

Figure 11B:
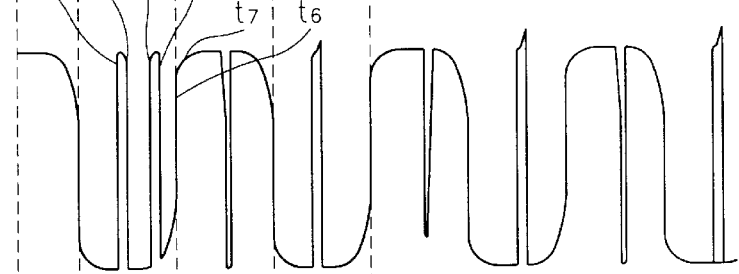

When the sine wave signal including noise components oscillated by means of quartz crystal oscillator circuit 91 is inputted to an input terminal of first CMOS inverter 101, that is, gate electrodes of P type MOS transistor 1011 and N type MOS transistor 1012, N type MOS transistor 1012 is turned-off and P type MOS transistor 1011 is turned-on so that at an output terminal thereof, a node N92 changes a high level, if the inputted sine wave signal including noise components is at a low level. If the inputted sine wave signal including noise components is at a high level, P type MOS transistor 1011 is turned-off and N type MOS transistor 1012 is turned-on so that at an output terminal thereof, a node N92 changes to a low level. For instance, when the sine wave signal including noise components oscillated by means of quartz crystal oscillator circuit 91 is at a low level for times $t_0 \sim t_1$ and $t_5 \sim t_9$, P type MOS transistor 1011 is turned-on so that at an output terminal thereof, a node N92 changes to a high level. On the other hand, when the sine wave signal including noise components is at a high level for times $t_1 \sim t_5$ or $t_9 \sim t_{11}$, N type MOS transistor 1012 is turned-on so that at an output terminal thereof, a node N92 changes to s a low level, as shown in FIG. 11B.

Figure 11C:
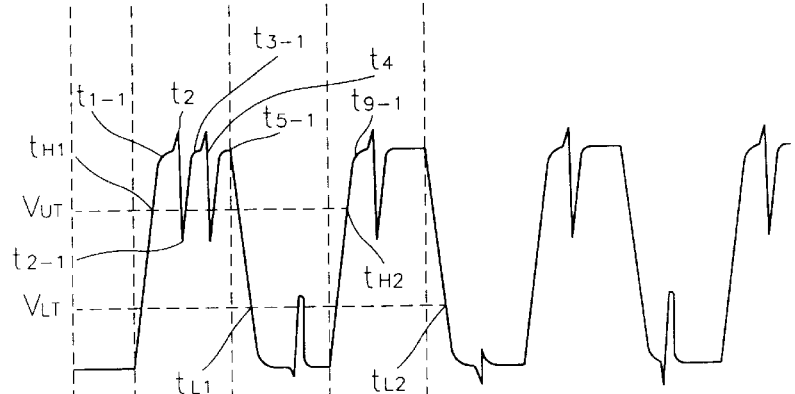

Then, when a square-wave signal including noise components from first CMOS inverter 101 is inputted into gate electrodes of P type MOS transistor 1021 and N type MOS transistor 1022 of first CMOS inverter 102 of Schmitt trigger 93, N type MOS transistor 1022 is turned-off and P type MOS transistor 1021 is turned-on so that at an output terminal thereof, a node N93 changes to a high level, as shown in FIG. 11C, if the inputted square-wave signal including noise components is at a low level. If the inputted square-wave signal including noise components is at a high level, P type MOS transistor 1021 is turned-off and N type MOS transistor 1022 is turned-on so that at an output terminal thereof, a node N93 changes to a low level.

At this time, a square-wave signal including noise components inputted from first CMOS inverter 101 to first CMOS inverter 102 and which is kept at a low level for times $t_1$~$t_2$ or $t_3$~$t_4$ changes to a high level at a time $t_2$ or $t_4$, and the output terminal of first CMOS inverter 102, that is, a node N93 changes from a high level to a low level at a time $t_2$ or $t_4$. In this case, when a node N93 changes from a high level to a low level, a node N93 which has been charged with a supply voltage $V_{DD}$ for times $t_{1-1}$~$t_2$ or $t_{3-1}$~$t_4$, is discharged with 0 volts through a turned-on N type MOS transistor 1022 for times $t_2$~$t_{2+1}$ or $t_4$~$t_{4+1}$. Since N type MOS transistor 1022 has a great resistance, the falling edge becomes slow so that a part of noise components included in the square-wave signal can be removed.

Figure 11D:
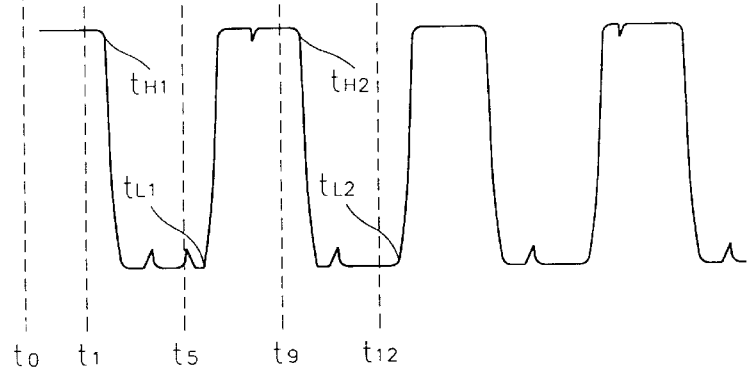

The signal having slow-rising and falling edges and having a part of noise components is removed is inputted into each gate electrode of P type MOS transistor 1031 and N type MOS transistor 1032 of second CMOS inverter 103. When the inputted signal which has been at low level for times $t_0$~$t_{H1}$ or $t_{L1}$~$t_{H2}$ reaches an upper threshold voltage $V_{UT}$, an output node N94 of Schmitt trigger 93 changes from a high level to a low level, as shown in FIG. 11D.

When a low level output signal is inputted into gate electrodes of P type MOS transistor 1041 and N type MOS transistor 1042 of third CMOS inverter 104, N type MOS transistor 1042 is turned-off and P type MOS transistor 1041 is turned-on. Accordingly, a node N94 changes to a high level and is fed back to each gate electrode of P type MOS transistor 1031 and N type MOS transistor 1032.

On the other hand, when the inputted signal which has slowly raised for times $t_{H1}$~$t_{1-1}$ or $t_{H2}$~$t_{9-1}$ changes to a high level at a time $t_{1-1}$ or $t_{9-1}$ and keeps at the high level until $t_{5-1}$ or $t_{12}$. And a time $t_{L1}$ or $t_{L2}$ when the inputted signal slowly falls and reaches a lower threshold voltage $V_{LT}$, an output node N94 of Schmitt trigger 93 is changed to a high level.

Schmitt trigger 93 has a hysteresis characteristic with respect to input and output voltages, as mentioned previously. State clock generator 94 generates state clock signals using the square-wave signal in which noise components can be removed and supplies the generated state clock signals to a microprocessor.

Figure 12:
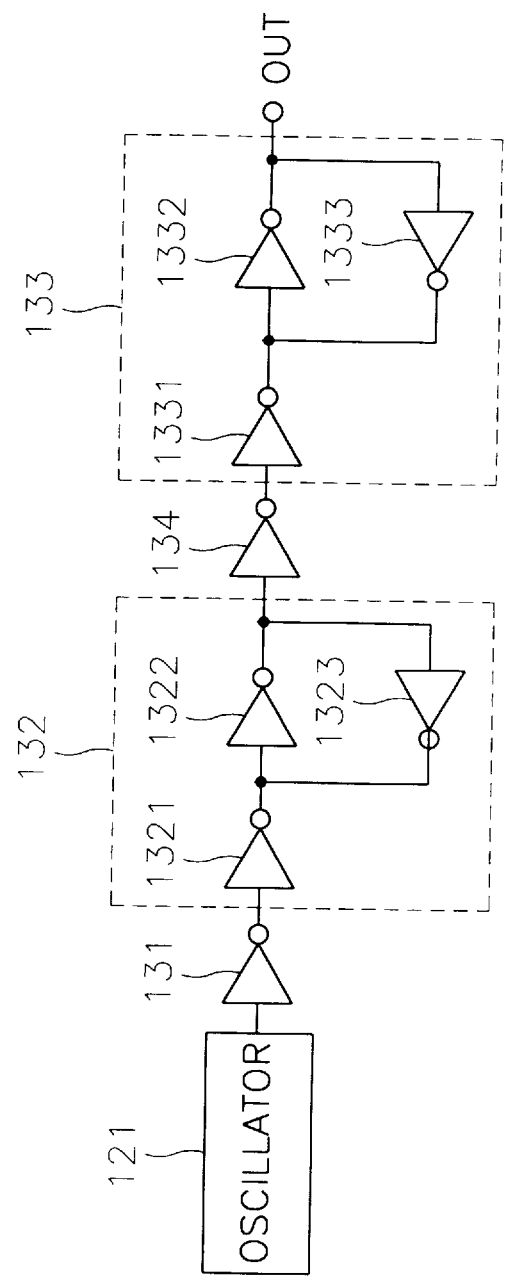
FIG. 12 is a circuit diagram for showing a configuration of a circuit for removing a noise of an oscillator according to a second embodiment of the present invention.
Figure 13:
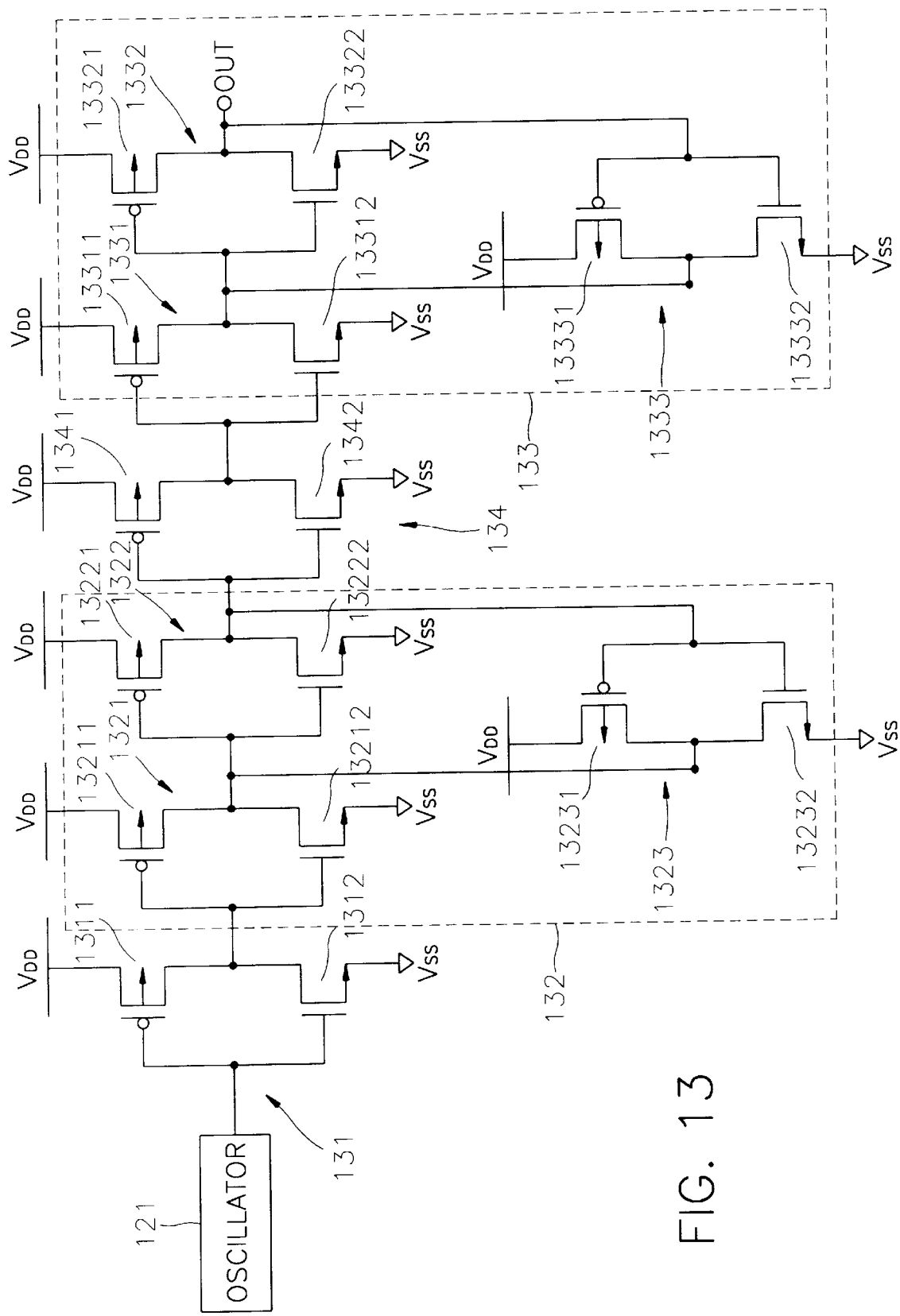
FIG. 13 is a circuit diagram for detailedly showing one example of the circuit for removing a noise of an oscillator shown in FIG. 12.

Hereinafter, a circuit for removing noise components of an oscillator according to the second embodiment of the present invention will be described. FIG. 12 shows a configuration of a circuit for removing noise components of an oscillator according to the second embodiment of the present invention. FIG. 13 is a circuit diagram for distally showing one example of the circuit for removing noise components of an oscillator shown in FIG. 12. FIGS. 14A to 14D are waveform diagrams of signals from components in FIG. 13.

A circuit for removing noise components of a quartz crystal oscillator according to a second embodiment of the present invention includes a square-wave generating inverter 130, a first Schmitt trigger 132, and a second Schmitt trigger 133.

Square-wave generating inverter 131 receives a sine wave signal including noise components oscillated by a quartz crystal oscillator circuit 121 and generates a square-wave signal having improved RC and integrator characteristics. Square-wave generating inverter 131 includes a complementary MOS inverter composed of a P type MOS transistor 1311 and an N type MOS transistor 1312.

First Schmitt trigger 132 receives the square-wave signal including the noise components from quare-wave generating inverter 131 and removes a part of the noise components included in the received square-wave signal. First Schmitt trigger 132 includes a first CMOS inverter 1321 for firstly inverting the square-wave signal including the noise components from quare-wave generating inverter 131, a second CMOS inverter 1322 connected to an output terminal of first CMOS inverter 1321 for secondly inverting the first-inverted square-wave signal from first CMOS inverter 1321, and a feedback inverter 1323 including an input terminal connected to an output terminal of second CMOS inverter 1322 and including an output terminal connected to an input terminal of second CMOS inverter 1322 for feedbacking the second-inverted square-wave signal to the input terminal of second CMOS inverter 1322.

Second Schmitt trigger 133 receives the square-wave signal with the part of the noise components removed from first Schmitt trigger 132 and removes noise components included in the received square-wave signal with the part of the noise components removed. Second Schmitt trigger 133 includes a first CMOS inverter 1331 for firstly inverting the square-wave signal with the part of the noise components removed from first Schmitt trigger 132, a second CMOS inverter 1332 connected to an output terminal of first CMOS inverter 1331 for secondly inverting the first-inverted square-wave signal from first CMOS inverter 1331, and a feedback inverter 1333 including an input terminal connected to an output terminal of second CMOS inverter 1332 and including an output terminal connected to an input terminal of second CMOS inverter 1332, for feedbacking the second-inverted square-wave signal to the input terminal of second CMOS inverter 1332.

The circuit for removing a noise of a quartz crystal oscillator according to a second embodiment of the present invention further includes a CMOS inverter 134 for inverting the square-wave signal with the part of the noise components removed from first Schmitt trigger 132 and supplies the inverted square-wave signal to second Schmitt trigger 133.

An operation of a circuit for removing noise components of a quartz crystal oscillator according to a second embodiment of the present invention will be described with reference to the accompanying drawings.

Figure 14A:
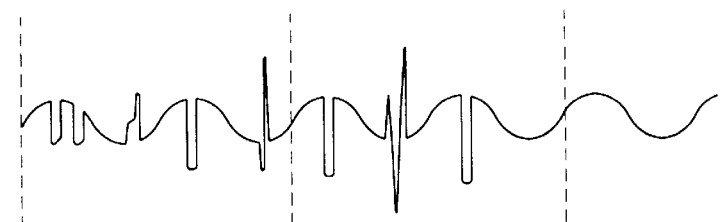
FIGS. 14A to 14D are waveform diagrams of signals from components in FIG. 13.
Figure 14B:
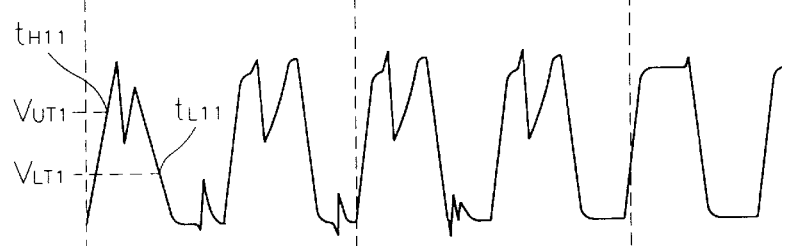
Figure 14C:
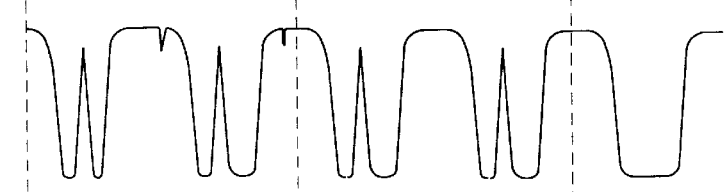
Figure 14D:

Square-wave generating inverter 131 receives a sine wave signal including noise components oscillated by a quartz crystal oscillator circuit 130 as shown in FIG. 14A, generates a square-wave signal having improved RC and integrator characteristics, and provides the generated square-wave signal to first Schmitt trigger 132, as shown in FIG. 14B. First CMOS inverter 1321 of first Schmitt trigger 132 firstly inverts the square-wave signal including the noise components from quare-wave generating inverter 131 and provides the firstly inverted square-wave signal to a second CMOS inverter 1322. Second CMOS inverter 1322 secondly inverts the first-inverted square-wave signal from first CMOS inverter 1321 and supplies the second-inverted square-wave signal, as shown in FIG. 14C, to CMOS inverter 134 and feedback inverter 1323. Feedback inverter 1323 feedbacks the second-inverted square-wave signal from second CMOS inverter 1322 to the input terminal of second CMOS inverter 1322. CMOS inverter 134 thirdly inverts the second-inverted square-wave signal from second CMOS inverter 1322 and outputs the third-inverted square-wave signal as shown in FIG. 14D to second Schmitt trigger 133.

Figure 14E:
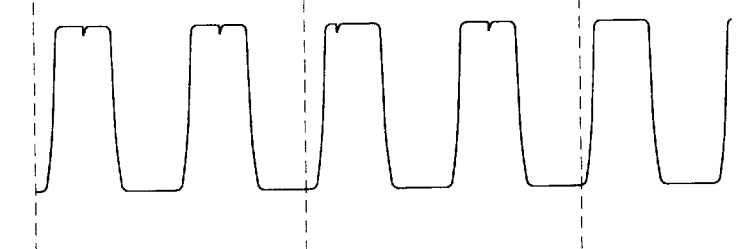

First CMOS inverter 1331 of second Schmitt trigger 133 firstly inverts the square-wave signal with a part of the noise components removed from first Schmitt trigger 132 and provides the firstly inverted square-wave signal to a second CMOS inverter 1332. Second CMOS inverter 1332 secondly inverts the first-inverted square-wave signal from first CMOS inverter 1331 and supplies the second-inverted square-wave signal to and feedback inverter 1333. Feedback inverter 1333 feedbacks the second-inverted square-wave signal from second CMOS inverter 1332 as shown in FIG. 14E to the input terminal of second CMOS inverter 1332 and outputs the second-inverted square-wave signal to an outside.

State clock generator (not shown) generates state clock signals by using the square-wave signal with the part of the noise components are removed and supplies the generated state clock signals to a microprocessor.

Figure 15:
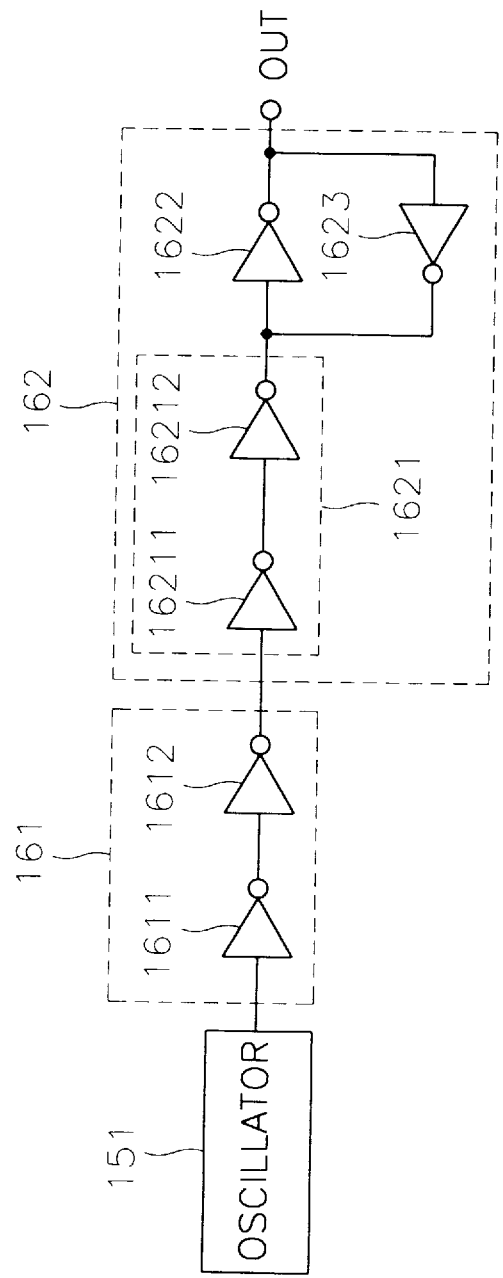
FIG. 15 is a circuit diagram for showing a configuration of a circuit for removing a noise of an oscillator according to a third embodiment of the present invention.
Figure 16:
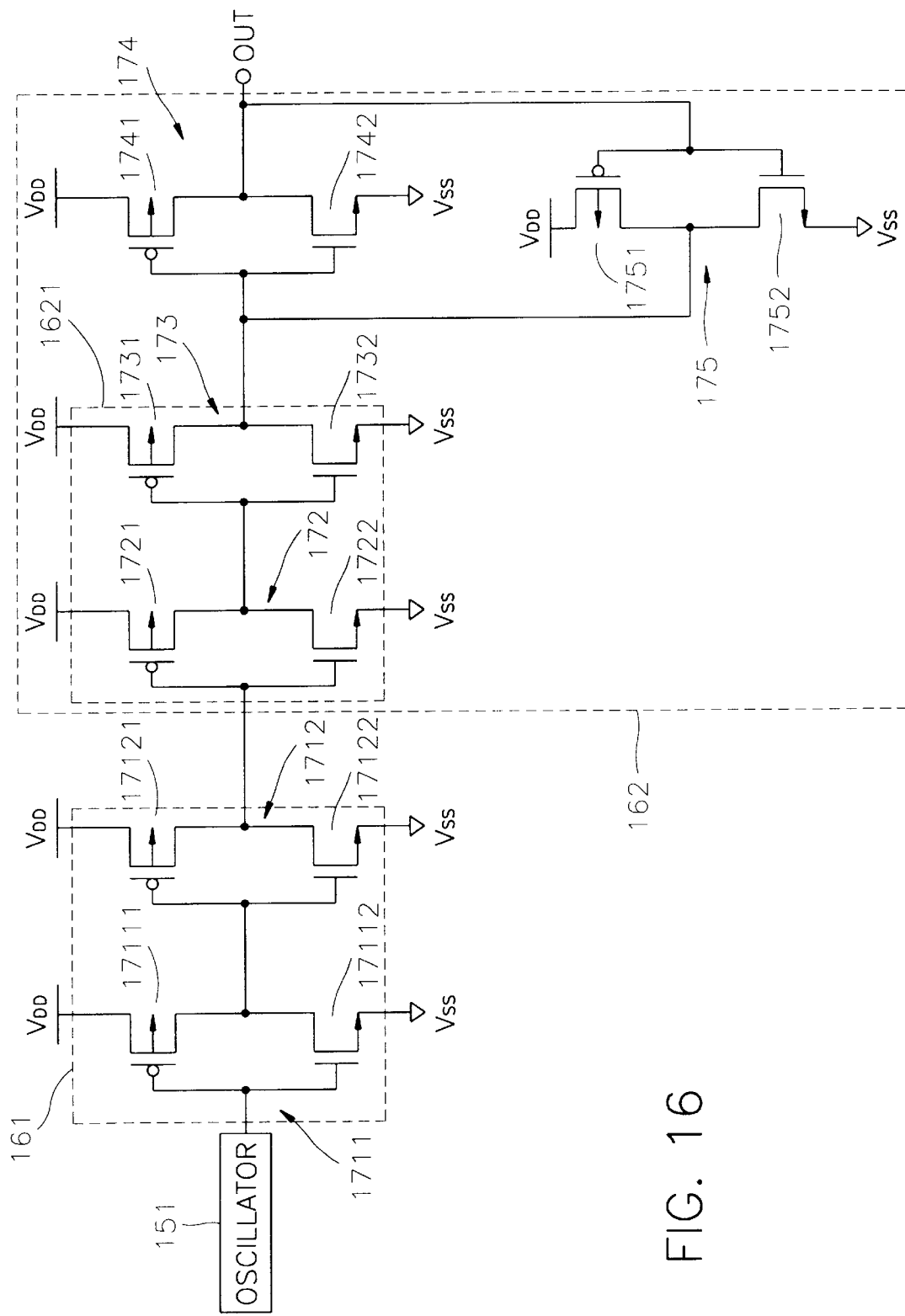
FIG. 16 is a circuit diagram for distally showing one example of the circuit for removing a noise of an oscillator shown in FIG. 15.

A circuit for removing noise components of an oscillator according to the third embodiment of the present invention will be described. FIG. 15 is a circuit diagram for showing a configuration of a circuit for removing a noise of an oscillator according to a third embodiment of the present invention. FIG. 16 is a circuit diagram for distally showing one example of the circuit for removing a noise of an oscillator shown in FIG. 15. FIGS. 17A to 17F are waveform diagrams of signals from components in FIG. 16.

The circuit for removing noise components of an oscillator according to the third embodiment of the present invention includes a variable duty cycle square-wave generating buffer 161 and a Schmitt trigger 162.

Variable duty cycle square-wave generating buffer 161 receives a sine wave signal including noise components oscillated by a quartz crystal oscillator circuit 151 and generates a square-wave signal whose duty cycle is controlled and which includes the noise components. Variable duty cycle square-wave generating buffer 161 includes a first inverter 1611 for firstly inverting the sine wave signal including the noise components from the oscillator to generate a firstly inverted square-wave signal, and a second inverter 1612 for secondly inverting the firstly inverted square-wave signal from first inverter 1611 to generate a secondly inverted square-wave signal. First inverter 1611 includes a first complementary MOS inverter 1711 constituted by a P type MOS transistor 17111 and an N type MOS transistor 17112, and second inverter 1612 includes a second complementary MOS inverter 1712 constituted by a P type MOS transistor 17121 and an N type MOS transistor 17122.

Schmitt trigger 162 receives the generated square-wave signal whose duty cycle is controlled and which includes the noise components, and removes the noise components included in the received square-wave signal. Schmitt trigger 162 includes an integrator 1621 for integrating the generated square-wave signal whose duty cycle is controlled and which includes the noise components, an inverter 1622 connected to an output terminal of integrator 1621, for inverting the integrated square-wave signal, and a feedback inverter 1623 having an input terminal connected to an output of inverter 1622 and an output terminal connected to an input terminal of inverter 1622, and for feedbacking the inverted square-wave signal to inverter 1622.

Integrator 1621 includes a first CMOS integrator 172 formed by a P type MOS transistor 1721 and an N type MOS transistor 1722 and for firstly inverting and integrating the generated square-wave signal whose a duty cycle is controlled and including the noise components, and a second CMOS integrator 173 formed by a P type MOS transistor 1731 and an N type MOS transistor 1732 and for secondly inverting and integrating the firstly inverted and integrated square-wave signal. Inverter 1622 includes a first CMOS inverter 174 formed by a P type MOS transistor 1741 and an N type MOS transistor 1742. Feedback inverter 175 includes a second CMOS inverter 175 formed by a P type MOS transistor 1751 and an N type MOS transistor 1752.

Channel lengths between drain electrodes and source electrodes of the P type MOS transistor and the N type MOS transistor of first and second CMOS integrator 172 and 173, and first and second CMOS inverters 174 and 175 are preferably longer than channel widths thereof so that the P type MOS transistor and the N type MOS transistor can have great resistances. A resistance of the second CMOS inverter 175 is preferably greater than resistances of first and second CMOS integrator 172 and 173.

An operation of a circuit for removing noise components of a quartz crystal oscillator according to a third embodiment of the present invention will be described with reference to the accompanying drawings.

When the sine wave signal including noise components oscillated by means of quartz crystal oscillator circuit 151, as shown in FIG. 17A, is inputted to gate electrodes of P type MOS transistor 17111 and N type MOS transistor 17112 of first CMOS inverter 1711 of variable duty cycle square-wave generating buffer 161, first CMOS inverter 1711 firstly inverts the inputted sine wave signal including noise components and outputs the firstly inverted square-wave signal to an input node N181 of first CMOS inverter 1711 if the inputted sine wave signal including noise components is at a low level for times $t_0 \sim t_1$ or $t_2 \sim t_3$. The output signal from first CMOS inverter 1711 to the input node N181 of first CMOS inverter 1711 has a high level waveform, as shown in FIG. 17B.

When a high level square-wave signal from first CMOS inverter 1711 is inputted to gate electrodes of P type MOS transistor 17121 and N type MOS transistor 17122 of second CMOS inverter 1712 of variable duty cycle square-wave generating buffer 161, second CMOS inverter 1712 secondly inverts the inputted square-wave signal including noise components and outputs the secondly inverted square-wave signal to an input node N182 of integrator 1621. The output signal from second CMOS inverter 1712 to the input node N182 of integrator 1621 has a low level waveform as shown in FIG. 17C.

On the other hand, if the inputted sine wave signal including noise components is at a high level for times $t_1 \sim t_2$ or $t_3 \sim t_4$, first CMOS inverter 1711 firstly inverts the inputted sine wave signal including noise components and outputs the firstly inverted square-wave signal to an input node N181 of CMOS inverter 1711. The output signal from first CMOS inverter 1711 to the input node N181 of first CMOS inverter 1711 has a high level waveform as shown in FIG. 17B.

When a low level square-wave signal from first CMOS inverter 1711 is inputted to second CMOS inverter 1712, second CMOS inverter 1712 secondly inverts the inputted low level square-wave signal and outputs the secondly inverted square-wave signal to an input node N182 of integrator 1621. The output signal from second CMOS inverter 1712 to the input node N182 of integrator 1621 has a high level waveform as shown in FIG. 17C. As mentioned above, the sine wave signal including noise components oscillated by means of quartz crystal oscillator circuit 151 becomes a square-wave signal whose duty cycle is controlled by variable duty cycle square-wave generating buffer 161.

In integrator 1621, first CMOS integrator 172 firstly inverts and integrates the generated square-wave signal whose duty cycle is controlled and which includes the noise components provided by variable duty cycle square-wave generating buffer 161, and provides the firstly inverted and integrated square-wave signal whose duty cycle is controlled and which includes the noise components to an input node N183 of second CMOS integrator 173. The output signal from first CMOS integrator 172 to the node N183 has a waveform as shown in FIG. 17D. For example, first CMOS integrator 172 integrates a square-wave signal whose duty cycle is controlled and which includes the noise components in order to remove a part of the noise components included in the square-wave signal for a time $t_1 \sim t_2$ when the noise components are included in the square-wave signal.

Second CMOS integrator 173 secondly inverts and integrates the generated square-wave signal with the part of the noise components therein removed, which is supplied by first CMOS integrator 172, and provides the secondly inverted and integrated square-wave signal with the part of the noise components therein further removed to an input node N184 of CMOS inverter 174. The output signal from second CMOS integrator 173 to the node N184 has a waveform as shown in FIG. 17E. For example, second CMOS integrator 173 integrates a square-wave signal with the part of the noise components therein removed in order to further remove a part of the noise components included in the square-wave signal for a time $t_2 \sim t_3$ when the noise components are included in the square-wave signal.

The square-wave signal with a part of the noise components further removed from second CMOS integrator 173 is inputted to each gate electrode of P type MOS transistor 1741 and N type MOS transistor 1742 of CMOS inverter 174. When the square-wave signal whose rising and falling edges are slow, which has a part of the noise components further removed, and which is kept at a low level for times $t_0 \sim t_{H1}$ or $t_{L1} \sim t_{H2}$ reaches an upper threshold voltage $V_{UT}$, an output node N185 of Schmitt trigger 162 transfers to a low level.

On the other hand, the signal in which a part of the noise components slowly rises for a time $t_{H1} \sim t_2$ changes to a high level at a time $t_2$ and keeps at a high level until a time $t_3$. And when the signal slowly falls at a time $t_3$ and reaches a lower threshold voltage $V_{LT}$, an output node N185 of Schmitt trigger 162 transfers to a high level.

In this manner, Schmitt trigger 162 has a hysteresis characteristic with respect to 20 input and output voltages, and outputs a square-wave signal with noise components removed, as shown in FIG. 17F. State clock generator (not shown) generates state clock signals using the square-wave signal with noise components removed and supplies the generated state clock signals to a microprocessor.

In the present invention, Square-wave generating inverter 92 receives a sine wave signal including noise components oscillated by a quartz crystal oscillator circuit 91, generates a square-wave signal having improved RC and integrator characteristics, and provides the generated square-wave signal to Schmitt trigger 93. Schmitt trigger 93 receives the square-wave signal including the noise components from square-wave generating inverter 92 and removes the noise components included in the received square-wave signal.

As mentioned above, a circuit for removing noise components oscillated by an oscillator according to the present invention can remove noise components included in a signal oscillated by an oscillator due to a surrounding influence such as a temperature. Therefore, the present invention can be used to generate state clocks which is used in a microprocessor and a microcontroller.

The invention has been described in detail in connection with the preferred embodiment. This embodiment, however, is merely for example only and the invention is not restricted thereto. It will be easily understood by those skilled in the art that other variations and modifications can easily be made within the scope of this invention as defined by the appended claims.

What is claimed is:

1. A circuit for removing noise components of an oscillator, said circuit comprising:
   an inverter for receiving a sine wave signal including noise components oscillated by an oscillator, and for generating a square-wave signal having improved RC and integrator characteristics; and
   a Schmitt trigger for receiving the square-wave signal including the noise components from said inverter, and for removing the noise components included in the received square-wave signal.

2. The circuit for removing noise components of an oscillator as claimed in claim 1, wherein said inverter includes a complementary MOS inverter composed of a P type MOS transistor and an N type MOS transistor, for inverting the sine wave signal including noise components oscillated by the oscillator.

3. The circuit for removing noise components of an oscillator as claimed in claim 1, wherein said Schmitt trigger includes a first inverter for firstly inverting the square-wave signal including the noise components from said inverter; a second inverter connected to an output terminal of said first inverter, for secondly inverting the first-inverted square-wave signal from said first inverter; and a feedback inverter including an input terminal connected to an output terminal of said second inverter and including an output terminal connected to an input terminal of said second inverter, for feedbacking the second-inverted square-wave signal to the input terminal of said second inverter.

4. The circuit for removing noise components of an oscillator as claimed in claim 3, wherein said first inverter is a first complementary MOS inverter constituted by a P type MOS transistor and an N type MOS transistor, said second inverter is a second complementary MOS inverter constituted by a P type MOS transistor and an N type MOS transistor, and said feedback inverter is a third complementary MOS inverter constituted by a P type MOS transistor and an N type MOS transistor.

5. The circuit for removing noise components of an oscillator as claimed in claim 4, wherein channel lengths between drain electrodes and source electrodes of the P type MOS transistor and the N type MOS transistor of the first complementary MOS inverter and the P type MOS transistor and the N type MOS transistor of the third complementary MOS inverter are longer than channel widths.

6. The circuit for removing noise components of an oscillator as claimed in is claim 4, wherein a resistance of the third complementary MOS inverter is greater than a resistance of the first complementary MOS inverter.

7. The circuit for removing noise components of an oscillator as claimed in claim 6, wherein a resistance ratio of the third complementary MOS inverter to the third complementary MOS inverter is about 1:5.

8. A circuit for removing a noise of an oscillator, said circuit comprising:

an inverter for receiving a sine wave signal including noise components oscillated by an oscillator, and for generating a square-wave signal having improved RC and integrator characteristics;

a first Schmitt trigger for receiving the square-wave signal including the noise components from said inverter, and for removing a part of the noise components included in the received square-wave signal; and a second Schmitt trigger for receiving the square-wave signal with a part of the noise components removed from said first Schmitt trigger, and for removing noise components included in the received square-wave signal with the part of the noise components removed.

9. The circuit for removing noise components of an oscillator as claimed in claim 8, wherein said inverter includes a complementary MOS inverter composed of a P type MOS transistor and an N type MOS transistor.

10. The circuit for removing noise components of an oscillator as claimed in claim 8, wherein said first Schmitt trigger includes a first inverter for firstly inverting the square-wave signal including the noise components from said inverter; a second inverter connected to an output terminal of said first inverter, for secondly inverting the first-inverted square-wave signal from said first inverter; and a feedback inverter including an input terminal connected to an output terminal of said second inverter and an output terminal connected to an input terminal of said second inverter, for feedbacking the second-inverted square-wave signal to the input terminal of said second inverter.

11. The circuit for removing noise components of an oscillator as claimed in claim 8, wherein said second Schmitt trigger includes a first inverter, for firstly inverting the square-wave signal with the part of the noise components removed from said first Schmitt trigger; a second inverter connected to an output terminal of said first inverter for secondly inverting the first-inverted square-wave signal from said first inverter; and a feedback inverter including an input terminal connected to an output terminal of said second inverter and an output terminal connected to an input terminal of said second inverter, for feedbacking the second-inverted square-wave signal to the input terminal of said second inverter.

12. The circuit for removing noise components of an oscillator as claimed in claim 8, further comprising a complementary MOS inverter for inverting the square-wave signal with the part of the noise components removed from said first Schmitt trigger and for supplying the inverted square-wave signal to said second Schmitt trigger.

13. A circuit for removing noise components of an oscillator, said circuit comprising:

a buffer for receiving a sine wave signal including noise components oscillated by an oscillator, and for generating a square-wave signal whose duty cycle is controlled and which includes the noise components; and a Schmitt trigger for receiving the generated square-wave signal whose duty cycle is controlled and which includes the noise components and for removing the noise components included in the received square-wave signal.

14. The circuit for removing noise components of an oscillator as claimed in claim 13, wherein said buffer includes a first inverter for firstly inverting the sine wave signal including the noise components from the oscillator to generate a firstly inverted square-wave signal, and a second inverter for secondly inverting the firstly inverted square-wave signal from said first inverter to generate a secondly inverted square-wave signal.

15. The circuit for removing noise components of an oscillator as claimed in claim 14, wherein said first inverter includes a first complementary MOS inverter constituted by a P type MOS transistor and an N type MOS transistor, and said second inverter includes a second complementary MOS inverter constituted by a P type MOS transistor and an N type MOS transistor.

16. The circuit for removing noise components of an oscillator as claimed in claim 13, wherein said Schmitt trigger includes an integrator for integrating the generated square-wave signal whose duty cycle is controlled and which includes the noise components, an inverter connected to an output terminal of said integrator for inverting the integrated square-wave signal, and a feedback inverter having an input terminal connected to an output of said inverter and an output terminal connected to an input terminal of said inverter, for feedbacking the inverted square-wave signal to said inverter.

17. The circuit for removing noise components of an oscillator as claimed in claim 16, wherein said integrator includes a first CMOS integrator formed by a P type MOS transistor and an N type MOS transistor, for firstly inverting and integrating the generated square-wave signal whose duty cycle is controlled and which includes the noise components, and a second complementary MOS integrator formed by a P type MOS transistor and an N type MOS transistor, for secondly inverting and integrating the firstly inverted and integrated square-wave signal; said inverter includes a first CMOS inverter formed by a P type MOS transistor and an N type MOS transistor; and said feedback inverter includes a second CMOS inverter formed by a P type MOS transistor and an N type MOS transistor.

18. The circuit for removing noise components of an oscillator as claimed in claim 17, wherein channel lengths between drain electrodes and source electrodes of the P type MOS transistor and the N type MOS transistor of said first and second CMOS integrator, and said first and second CMOS inverters are longer than channel widths.

19. The circuit for removing noise components of an oscillator as claimed in claim 17, wherein a resistance of the second CMOS inverter is greater than resistances of said first and second CMOS integrator.

* * * * *